(12) United States Patent
Matsuura et al.

(10) Patent No.: US 10,910,251 B2
(45) Date of Patent: Feb. 2, 2021

(54) PIN CONTROL METHOD AND SUBSTRATE PROCESSING APPARATUS

(71) Applicant: TOKYO ELECTRON LIMITED, Tokyo (JP)

(72) Inventors: Shin Matsuura, Miyagi (JP); Masato Horiguchi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 61 days.

(21) Appl. No.: 16/427,874

(22) Filed: May 31, 2019

(65) Prior Publication Data

US 2019/0287844 A1 Sep. 19, 2019

Related U.S. Application Data

(62) Division of application No. 15/951,583, filed on Apr. 12, 2018, now Pat. No. 10,438,834.

(30) Foreign Application Priority Data

Apr. 14, 2017 (JP) ................................. 2017-080697

(51) Int. Cl.
*H01L 21/68* (2006.01)
*H01L 21/687* (2006.01)
(Continued)

(52) U.S. Cl.
CPC .... *H01L 21/68742* (2013.01); *H01L 21/3065* (2013.01); *H01L 21/6719* (2013.01);
(Continued)

(58) Field of Classification Search
None
See application file for complete search history.

(56) References Cited

U.S. PATENT DOCUMENTS

| 4,790,258 A | 12/1988 | Drage et al. |
| 5,065,495 A | 11/1991 | Narushima et al. |

(Continued)

FOREIGN PATENT DOCUMENTS

| JP | 2007-242850 A | 9/2007 |
| JP | 2011-54933 A | 3/2011 |

OTHER PUBLICATIONS

Trek Application Note, No. 6002. The Electrostatic Semiconductor Wafer Clamping/Chucking System (ESC). 2013, pp. 1-8.

*Primary Examiner* — Karla A Moore
*Assistant Examiner* — Tiffany Z Nuckols
(74) *Attorney, Agent, or Firm* — Rothwell, Figg, Ernst & Manbeck, P.C.

(57) ABSTRACT

A substrate processing apparatus includes a processing container; a placement table; a plurality of pins provided on the placement table configured to perform delivery of the substrate; a plurality of drivers configured to vertically drive the plurality of pins, respectively; a plurality of measuring devices each including an encoder configured to measure height positions of the plurality of pins, respectively. The substrate processing apparatus also includes a controller configured to: measure the height positions of the plurality of pins; select a reference pin; estimate a reference height position; calculate an adjustment speed for making the height positions of the pins other than the reference pin match with the estimated reference height position; and control the drivers, which drive the other pins, to adjust driving speeds of the other pins to an adjustment speed.

6 Claims, 4 Drawing Sheets

(51) Int. Cl.
*H01L 21/67* (2006.01)
*H01L 21/677* (2006.01)
*H01L 21/3065* (2006.01)

(52) U.S. Cl.
CPC .. *H01L 21/67259* (2013.01); *H01L 21/67739* (2013.01); *H01L 21/68* (2013.01)

(56) References Cited

U.S. PATENT DOCUMENTS

| | | |
|---|---|---|
| 6,169,032 B1 | 1/2001 | Murakami et al. |
| 2003/0205329 A1 | 11/2003 | Gujer et al. |
| 2004/0212114 A1 | 10/2004 | Kashiwagi et al. |
| 2006/0156981 A1 | 7/2006 | Fondurulia et al. |
| 2006/0291835 A1 | 12/2006 | Nozaki et al. |
| 2012/0009800 A1 | 1/2012 | Futase et al. |
| 2014/0174660 A1 | 6/2014 | Iwasaki |
| 2016/0276203 A1 | 9/2016 | Gratrix |

PIN CONTROL METHOD AND SUBSTRATE PROCESSING APPARATUS

CROSS-REFERENCE TO RELATED APPLICATIONS

This application is a divisional application of U.S. application Ser. No. 15/951,583, filed on Apr. 12, 2018, which claims priority to Japanese Patent Application No. 2017-080697, filed on Apr. 14, 2017, the disclosures of which are incorporated herein in their entirety by reference, and priority is claimed to each of the foregoing.

TECHNICAL FIELD

Various aspects and exemplary embodiments of the present disclosure relate to a pin control method and a substrate processing apparatus.

BACKGROUND

In a substrate processing apparatus that perform a substrate processing such as, for example, etching or film formation, a plurality of pins is provided on a placement table so as to protrude and retreat from a placement surface of the placement table on which a substrate such as, for example, a semiconductor wafer is placed. Then, as the pins are raised or lowered, the delivery of the substrate is carried out. As a method of controlling the plurality of pins, for example, there is a method of vertically driving a base member, to which the plurality of pins is attached, by a single driving unit so as to raise or lower the plurality of pins collectively via the base member. See, e.g., Japanese Patent Laid-Open Publication No. 2011-054933.

SUMMARY

According to an aspect of the present disclosure, there is provided a pin control method including measuring respective height positions of a plurality of pins, which is vertically driven respectively by a plurality of driving units while supporting a substrate, selecting a reference pin, which serves as a reference for speed control, from the plurality of pins using the measured height positions of the plurality of pins, estimating, with respect to the selected reference pin, a reference height position, which is a height position after a predetermined time has passed since the height positions of the plurality of pins were measured, and calculating an adjustment speed for making the height positions of the pins other than the reference pin match with the estimated reference height position, and controlling the driving units, which drive the other pins, to adjust driving speeds of the other pins to the adjustment speed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
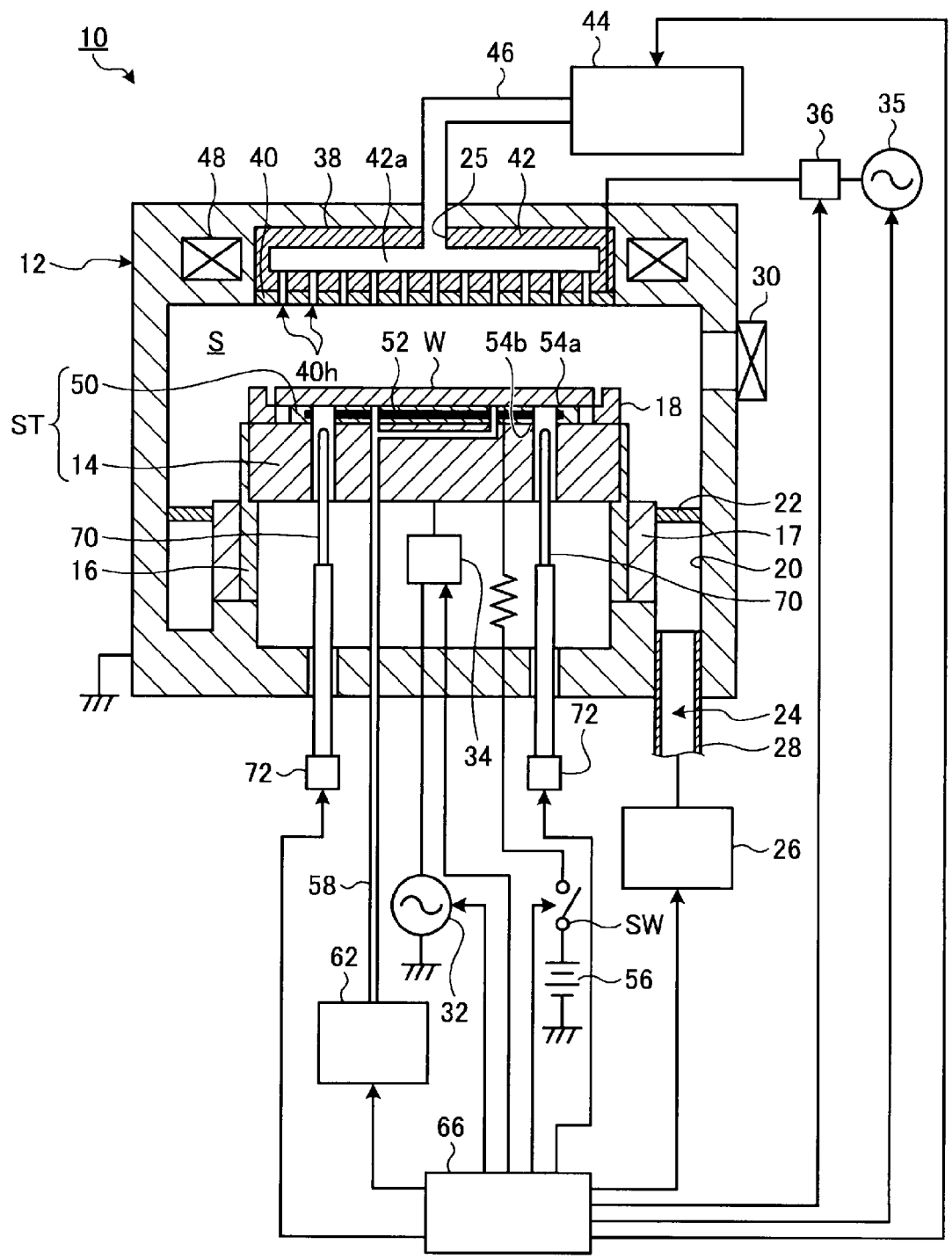
FIG. 1 is a view schematically illustrating a substrate processing apparatus according to one exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The technique described above has a problem in that a difference occurs between the height positions of the plurality of pins depending on the inclination of the base member, and as a result, the position of the substrate supported by the plurality of pins deviates from a predetermined position.

On the other hand, a method that does not use a base member is considered as follows. For example, a method is considered in which a plurality of driving units is independently provided for a plurality of pins and the plurality of pins is respectively driven by the plurality of driving units. However, in this method, a difference occurs between the height positions of the plurality of pins due to unevenness in the driving speeds of the respective pins, and as a result, there is a possibility that of the positional deviation of the substrate occurs.

A pin control method according to one aspect disclosed here includes: measuring respective height positions of a plurality of pins, which is vertically driven respectively by a plurality of driving units while supporting a substrate; selecting a reference pin, which serves as a reference for speed control, from the plurality of pins using the measured height positions of the plurality of pins; estimating, with respect to the selected reference pin, a reference height position, which is a height position after a predetermined time has passed since the height positions of the plurality of pins were measured; calculating an adjustment speed for making the height positions of the pins other than the reference pin match with the estimated reference height position; and controlling the driving units, which drive the other pins, to adjust driving speeds of the other pins to the adjustment speed.

In the above-described pin control method, the selecting includes selecting, as the reference pin, the pin with a lowest height position or a highest height position, from the plurality of pins when the measured height positions of the plurality of pins do not match with each other.

In the above-described pin control method, the estimating includes: calculating a driving speed of the reference pin at a measurement timing, at which the height positions of the plurality of pins are measured, based on a passed time from start of driving of the plurality of pins by the plurality of driving units to the measurement timing and the height position of the reference pin measured at the measurement timing; and estimating the reference height position based on the calculated driving speed of the reference pin, the predetermined time, and the height position of the reference pin measured at the measurement timing.

In the above-described pin control method, the measuring includes newly measuring the respective height positions of the plurality of pins whenever the predetermined time has passed since the height positions of the plurality of pins were measured last time, and the selecting processing, the estimating processing, and the adjusting processing are repeatedly executed until the newly measured height positions of the plurality of pins match with each other.

In the above-described pin control method, the adjusting includes controlling the driving units, which drive the other pins, to adjust the driving speeds of the other pins to a driving speed of the reference pin when the height positions of the plurality of pins match with each other.

In the above-described pin control method, the height positions of the plurality of pins are positions of tip ends of the plurality of pins on the basis of a placement surface of a placement table for the substrate or a reference surface that is lower than the placement surface by a predetermined distance.

A substrate processing apparatus according to one aspect disclosed here includes: a processing container; a placement table provided in the processing container and configured to place a substrate thereon; a plurality of pins provided on the placement table so as to protrude and retreat from the placement surface of the placement table and configured to perform delivery of the substrate; a plurality of driving units configured to vertically drive the plurality of pins, respectively; a plurality of measuring devices configured to measure height positions of the plurality of pins, respectively; and a controller configured to: measure the respective height positions of the plurality of pins, which is vertically driven respectively by the plurality of driving units while supporting the substrate; select a reference pin, which serves as a reference for speed control, from the plurality of pins using the measured height positions of the plurality of pins; estimate, with respect to the selected reference pin, a reference height position, which is a height position after a predetermined time has passed since the height positions of the plurality of pins were measured; calculate an adjustment speed for making the height positions of the pins other than the reference pin match with the estimated reference height position; and control the driving units, which drive the other pins, to adjust driving speeds of the other pins to the adjustment speed.

According to one aspect of a pin control method disclosed here, it is possible to prevent misalignment of a substrate.

Hereinafter, exemplary embodiments of a pin control method and a substrate processing apparatus disclosed herein will be described in detail with reference to the drawings. Further, in the respective drawings, similar components will be denoted by similar reference numerals.

FIG. 1 is a view schematically illustrating a substrate processing apparatus according to one exemplary embodiment. FIG. 1 illustrates a cross section of the substrate processing apparatus according to the exemplary embodiment.

As illustrated in FIG. 1, the substrate processing apparatus 10 of the exemplary embodiment is a parallel flat plate type plasma processing apparatus. The substrate processing apparatus 10 includes a processing container 12. The processing container 12 has a substantially cylindrical shape, and defines a processing space S as an inner space therein. The substrate processing apparatus 10 includes a stage ST in the processing container 12. The stage ST is a placement table on which a semiconductor wafer (hereinafter referred to as "wafer") W as a target processing substrate is placed. In one exemplary embodiment, the stage ST includes a stand 14 and an electrostatic chuck 50. The stand 14 has a substantially disk shape and is provided below the processing space S. The stand 14 is formed of aluminum, for example, and constitutes a lower electrode.

In one exemplary embodiment, the substrate processing apparatus 10 further includes a cylindrical holding unit 16 and a cylindrical support unit 17. The cylindrical holding unit 16 is in contact with edge portions of the side surface and the bottom surface of the stand 14, and holds the stand 14. The cylindrical support unit 17 extends in the vertical direction from the bottom portion of the processing container 12, and supports the stand 14 via the cylindrical holding unit 16.

The substrate processing apparatus 10 further includes a focus ring 18. The focus ring 18 is placed on the upper surface of a peripheral edge portion of the stand 14. The focus ring 18 is a member for improving in-plane uniformity of the processing accuracy of the wafer W. The focus ring 18 is a plate-shaped member having a substantially annular shape, and is formed of, for example, silicon, quartz, or silicon carbide.

In one exemplary embodiment, an exhaust path 20 is formed between the sidewall of the processing container 12 and the cylindrical support unit 17. A baffle plate 22 is attached to an inlet of the exhaust path 20 or in the middle thereof. Further, an exhaust port 24 is provided in the bottom portion of the exhaust path 20. The exhaust port 24 is defined by an exhaust pipe 28, which is fitted in the bottom portion of the processing container 12. An exhaust device 26 is connected to the exhaust pipe 28. The exhaust device 26 has a vacuum pump, and may decompress the processing space S in the processing container 12 to a predetermined degree of vacuum. A gate valve 30 is attached to the sidewall of the processing container 12 to open and close the carry-in/out port of the wafer W.

A high-frequency power supply 32 for plasma generation is electrically connected to the stand 14 via a matcher 34. The high-frequency power supply 32 applies high-frequency power having a predetermined high frequency (e.g., 13 MHz) to a lower electrode, that is, the stand 14.

The substrate processing apparatus 10 further includes a shower head 38 in the processing container 12. The shower head 38 is provided above the processing space S. The shower head 38 includes an electrode plate 40 and an electrode support body 42.

The electrode plate 40 is a conductive plate having a substantially disk shape and constitutes an upper electrode. A high-frequency power supply 35 for plasma generation is electrically connected to the electrode plate 40 via a matcher 36. The high-frequency power supply 35 applies high-frequency power having a predetermined high frequency (e.g., 60 MHz) to the electrode plate 40. When high-frequency power is applied to the stand 14 and the electrode plate 40 by the high-frequency power supply 32 and the high-frequency power supply 35, respectively, a high-frequency electric field is formed in the space between the stand 14 and the electrode plate 40, that is, in the processing space S.

A plurality of gas vent holes 40$h$ is formed in the electrode plate 40. The electrode plate 40 is detachably supported by the electrode support body 42. A buffer chamber 42$a$ is provided inside the electrode support body 42. The substrate processing apparatus 10 further includes a gas supply unit 44, and the gas supply unit 44 is connected to a gas introduction port 25 of the buffer chamber 42$a$ via a gas supply conduit 46. The gas supply unit 44 supplies a processing gas to the processing space S. The processing gas may be, for example, a processing gas for etching or a processing gas for film formation. In the electrode support body 42, a plurality of holes, each continuing to a corresponding one of the plurality of gas vent holes 40$h$, is formed, and the plurality of holes communicate with the buffer chamber 42a. The gas supplied from the gas supply unit 44 is supplied to the processing space S through the buffer chamber 42a and the gas vent holes 40h.

In one exemplary embodiment, a magnetic field forming mechanism 48 is provided on the ceiling portion of the processing container 12 so as to extend annularly or concentrically. The magnetic field forming mechanism 48 functions to facilitate the start of high-frequency discharge (plasma ignition) in the processing space S and stably maintain the discharge.

In the substrate processing apparatus 10, the electrostatic chuck 50 is provided on the upper surface of the stand 14. The electrostatic chuck 50 includes a pair of insulating films 54a and 54b and an electrode 52 sandwiched between the pair of insulating films 54a and 54b. A DC power supply 56 is connected to the electrode 52 via a switch SW. When a DC voltage is applied from the DC power supply 56 to the electrode 52, a Coulomb force is generated, and the wafer W is attracted to and held on the electrostatic chuck 50 by the Coulomb force.

In one exemplary embodiment, the substrate processing apparatus 10 further includes a gas supply line 58 and a heat transfer gas supply unit 62. The heat transfer gas supply unit 62 is connected to the gas supply line 58. The gas supply line 58 extends to the upper surface of the electrostatic chuck 50 and extends annularly on the upper surface. The heat transfer gas supply unit 62 supplies a heat transfer gas such as, for example, He gas to the space between the upper surface of the electrostatic chuck 50 and the wafer W.

(Configuration of Stage ST)

Figure 2:
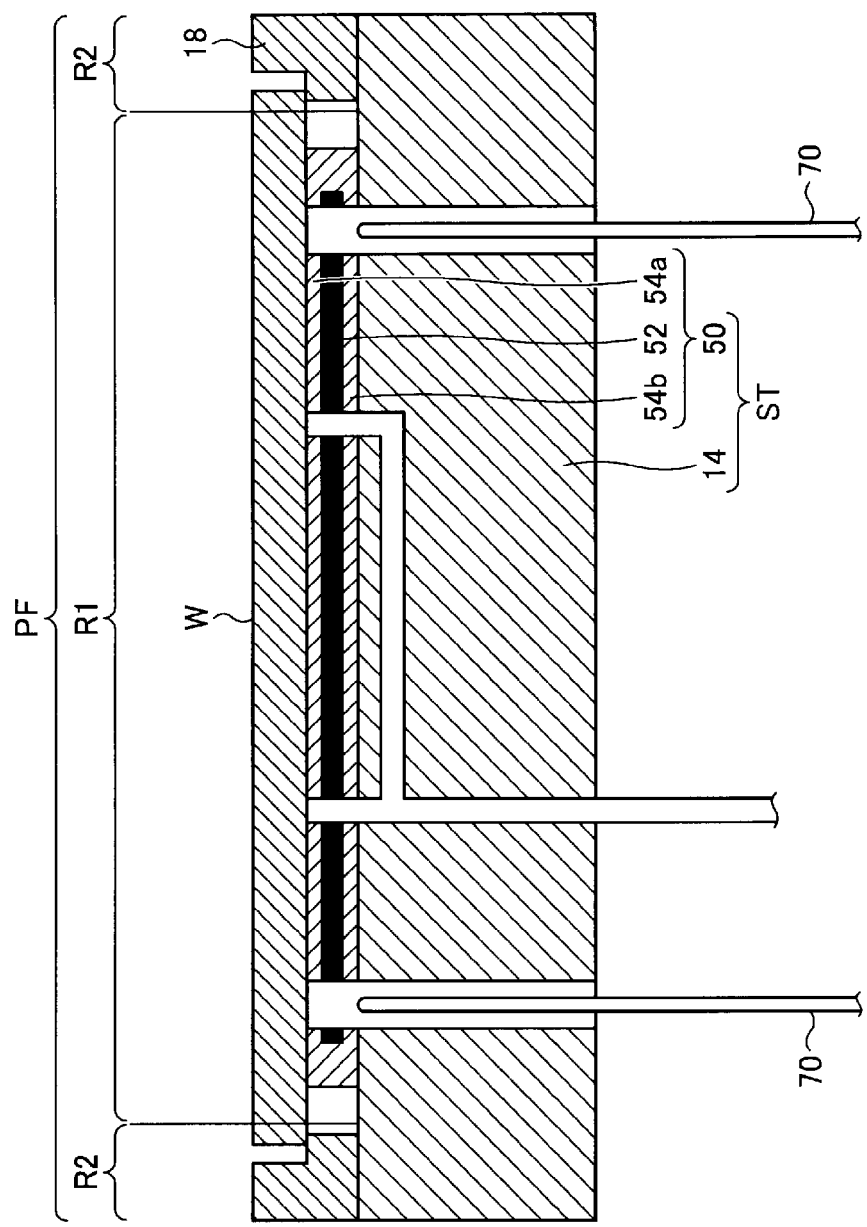
FIG. 2 is an enlarged cross-sectional view of a stage ST of the substrate processing apparatus illustrated in FIG. 1.

FIG. 2 is an enlarged cross-sectional view of the stage ST of the substrate processing apparatus illustrated in FIG. 1. As illustrated in FIG. 2, the stage ST has a placement surface PF. The placement surface PF includes a first region R1 and a second region R2. The first region R1 is a region for placing the wafer W. In one exemplary embodiment, the first region R1 is defined by the upper surface of the electrostatic chuck 50, and is a substantially circular region. The first region R1 is an example of the placement surface of the stage ST. The second region R2 is a region for placing the focus ring 18, and is provided annularly so as to surround the first region R1. In one exemplary embodiment, the second region R2 is defined by the upper surface of a peripheral edge portion of the stand 14.

A plurality of pins 70 is provided on the stage ST so as to protrude and retreat from the placement surface of the stage ST (that is, the first region R1). The plurality of pins 70 is provided, for example, in a plurality of holes equidistantly provided in the circumferential direction of the stage ST via seal members such as, for example, O-rings. In one exemplary embodiment, three holes are equidistantly provided in the circumferential direction, and three pins 70 are provided in the three holes.

The plurality of pins 70 is independently connected to a plurality of driving units 72 (see FIG. 1), and is vertically driven by the plurality of driving units 72, respectively. For example, each driving unit 72 includes a motor and a ball screw, and converts the rotational motion of the motor into linear motion by the ball screw, thereby raising or lowering each pin 70. Then, as the plurality of pins 70 is raised, the delivery of the wafer W is performed between the plurality of pins 70 and a transfer arm, which transfers the wafer W into the processing container 12 via the gate valve 30. Then, as the plurality of pins 70 to which the wafer W has been delivered is lowered, the wafer W is placed on the placement surface of the stage ST (that is, the upper surface of the second region R1).

Further, a plurality of measuring devices (not illustrated) such as, for example, encoders is provided in the plurality of driving units 72, and the plurality of measuring devices measure the height positions of the plurality of pins 70 respectively. Here, the height positions of the plurality of pins 70 are the positions of the tip ends of the plurality of pins 70 on the basis of the placement surface of the stage ST or a reference surface that is lower than the placement surface by a predetermined distance.

Returning to the description of FIG. 1, in one exemplary embodiment, the substrate processing apparatus 10 further includes a controller 66. The controller 66 is connected to the exhaust device 26, the switch SW, the high-frequency power supply 32, the matcher 34, the high-frequency power supply 35, the matcher 36, the gas supply unit 44, and the heat transfer gas supply unit 62. The controller 66 sends a control signal to each of the exhaust device 26, the switch SW, the high-frequency power supply 32, the matcher 34, the high-frequency power supply 35, the matcher 36, the gas supply unit 44, and the heat transfer gas supply unit 62. By the control signal from the controller 66, exhaust by the exhaust device 26, the opening and closing of the switch SW, the supply of power from the high-frequency power supply 32, the impedance adjustment of the matcher 34, the supply of power from the high-frequency power supply 35, the impedance adjustment of the matcher 36, the supply of the processing gas by the gas supply unit 44, and the supply of the heat transfer gas by the heat transfer gas supply unit 62 are controlled.

In the substrate processing apparatus 10, the processing gas is supplied from the gas supply unit 44 to the processing space S. Further, a high-frequency electric field is formed between the electrode plate 40 and the stand 14, that is, in the processing space S. Thereby, plasma is generated in the processing space S, and a processing of the wafer W is performed by, for examples, radicals of elements contained in the processing gas. Further, the processing of the wafer W may be an arbitrary processing, and may be, for example, etching of the wafer W or film formation on the wafer W, but is not limited thereto.

Further, the controller 66 controls the plurality of driving units 72 so as to perform a pin control method to be described later. To give a detailed example, the controller 66 measures the respective height positions of the plurality of pins 70, which is vertically driven by the plurality of driving units 72 while supporting the wafer W. Then, the controller 66 selects a reference pin, which serves as the reference for speed control, from the plurality of pins 70 using the measured height positions of the plurality of pins 70. Then, the controller 66 estimates a reference height position, which is the height position after a predetermined time has passed since the height positions of the plurality of pins 70 were measured, with respect to the selected reference pin. Then, the controller 66 calculates the adjustment speed for making the height positions of the pins other than the reference pin match with the estimated reference height position, and controls the driving units 72, which drive the other pins, to adjust the driving speeds of the other pins to the adjustment speed. Here, the height positions of the plurality of pins 70 are the positions of the tip ends of the plurality of pins 70 on the basis of the placement surface of the stage ST or the reference surface that is lower than the placement surface by a predetermined distance. Further, the height positions of the plurality of pins 70 are measured respectively using a plurality of measuring devices (not illustrated) such as, for example, encoders provided in the plurality of driving sections 72, respectively.

Figure 3:
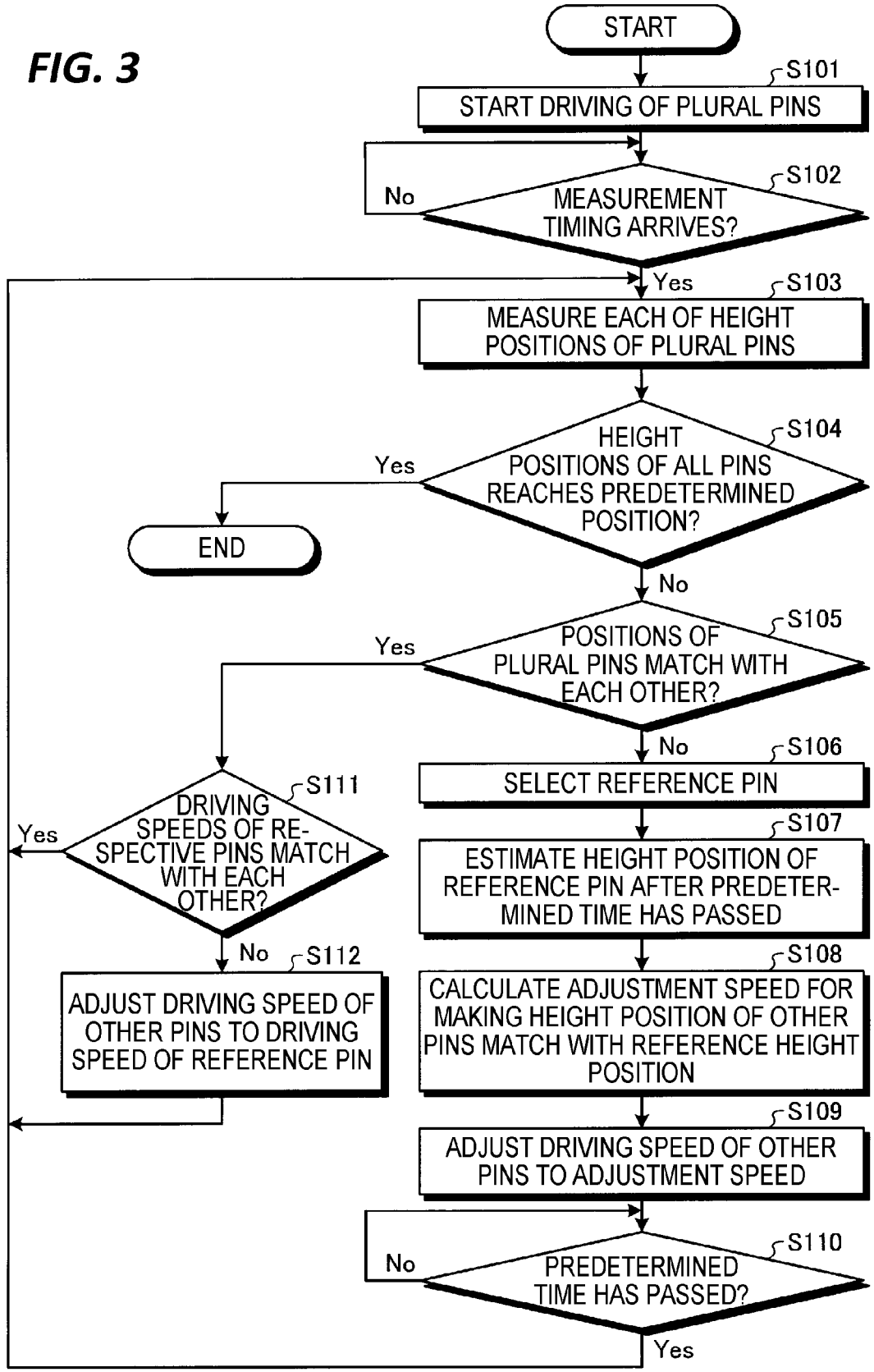
FIG. 3 is a flowchart illustrating an exemplary flow of a pin control method according to one exemplary embodiment.

Next, a pin control method according to one exemplary embodiment will be described. FIG. 3 is a flowchart illustrating an exemplary flow of a pin control method according to one exemplary embodiment. Further, here, the flow of a processing in a case where, as the plurality of pins 70 is raised, the delivery of the wafer W is performed between the plurality of pins 70 and the transfer arm, which transfers the wafer W into the processing container 12 through the gate valve 30, will be described.

As illustrated in FIG. 3, when the wafer W is transferred into the processing container 12 by the transfer arm, the controller 66 of the substrate processing apparatus 10 starts driving the plurality of pins 70 (step S101). At this time, the driving speeds of the plurality of pins 70 are set to the same speed.

The controller 66 stands by until a predetermined timing (hereinafter referred to as "measurement timing") for measuring the height positions of the plurality of pins 70 arrives (No in step S102). Then, when the measurement timing arrives (Yes in step S102), the controller 66 measures the respective height positions of the plurality of pins 70 (step S103).

The controller 66 determines whether or not the height positions of all of the pins 70 reach a predetermined position using the measured height positions of the plurality of pins 70 (step S104). The predetermined position is, for example, the position determined so that the wafer W, transferred from the transfer arm to the plurality of pins 70, does not interfere with the transfer arm. When the height positions of all of the pins 70 reach the predetermined position (Yes in step S104), the controller 66 ends the processing.

On the other hand, when the height positions of all of the pins 70 have not reached the predetermined position (No in step S104), the controller 66 determines whether or not the measured height positions of the plurality of pins 70 match with each other (step S105). Here, since the driving speeds of the plurality of pins 70 are set to the same speed at the start of driving of the plurality of pins 70, in principle, the height positions of the plurality of pins 70 will match with each other. However, since the plurality of pins 70 is provided, for example, in the plurality of holes, which is provided in the stage ST, via the seal members such as, for example, O-rings, the state of friction between the respective pins 70 and the seal members may be uneven. When the state of friction between the respective pins 70 and the seals member is uneven, the driving speeds of the plurality of pins 70 may be uneven, and as a result, there may be the difference between the height positions of the plurality of pins 70.

When the measured height positions of the plurality of pins 70 do not match with each other (step S105 No), the controller 66 selects a reference pin, which serves as the reference for speed control, from the plurality of pins 70 based on the height positions of the plurality of pins 70 (step S106). For example, the controller 66 selects, as the reference pin, the pin 70 having the lowest height position or the highest height position, from the plurality of pins 70.

Subsequently, the controller 66 estimates, with respect to the selected reference pin, a reference height position, which is the height position of the reference pin after a "predetermined time" has passed since the height positions of the plurality of pins 70 were measured (step S107). Specifically, the controller 66 calculates the driving speed of the reference pin at the measurement timing based on the passed time from the start of driving of the plurality of pins 70 to the measurement timing and the height position of the reference pin measured at the measurement timing. Then, the controller 66 estimates the reference height position based on the calculated driving speed of the reference pin, the aforementioned "predetermined time", and the height position of the reference pin measured at the measurement timing.

Subsequently, the controller 66 calculates an adjustment speed for making the height positions of the pins other than the reference pin match with the estimated reference height position (step S108). Specifically, the controller 66 calculates the adjustment speed based on the reference height position, the height positions of the other pins at the measurement timing, and the aforementioned "predetermined time".

Subsequently, the controller 66 controls the driving units 72, which drive the other pins, to adjust the driving speeds of the other pins to the adjustment speed (step S109). In this way, since the driving speeds of the other pins are adjusted to the adjustment speed for making the height positions of the other pins match with the reference height position, the difference between the height position of the reference pin and the height positions of the pins, other than the reference pin, is prevented at a point in the time when the "predetermined time" has passed. As a result, it is possible to prevent misalignment of the wafer W due to the difference between the height positions of the pins 70, which supports the wafer W.

Subsequently, the controller 66 stands by until the aforementioned "predetermined time" passes (No in step S110). Then, when the "predetermined time" has passed (Yes in step S110), the controller 66 returns the processing to step S103 in order to newly measure the respective height positions of the plurality of pins 70. Thereby, the height positions of the plurality of pins 70 are newly measured whenever the aforementioned "predetermined time" has passed since the heights of the plurality of pins 70 were measured last time. Then, the selection of the reference pin, the estimation of the reference height position, and the adjustment of the driving speeds of the other pins are repeatedly executed until the newly measured height positions of the plurality of pins 70 match with each other (step S103, No in step S104, No in step S105, and steps S106 to S110). Thereby, since the height positions of the plurality of pins 70 may continuously match with each other, misalignment of the wafer W may be further prevented.

On the other hand, when the measured height positions of the plurality of pins 70 match with each other (Yes in step S105), the controller 66 determines whether or not the driving speeds of the respective pins 70 match with each other (step S111). When the driving speeds of the respective pins 70 match with each other (Yes in step S111), the controller 66 returns the processing to step S103 since it is not necessary to adjust the driving speed.

On the other hand, when the driving speeds of the respective pins 70 do not match with each other (No in step S111), the controller 66 performs the following processings since the driving speeds of the other pins are temporarily adjusted to the adjustment speed. That is, the controller 66 controls the driving units 72, which drive the other pins 70, to adjust the driving speeds of the other pins to the driving speed of the reference pin (step S112), and returns the processing to step S103. Since the driving speeds of the other pins are adjusted to the driving speed of the reference pin, the driving speeds of the respective pins 70 match with each other.

Figure 4:
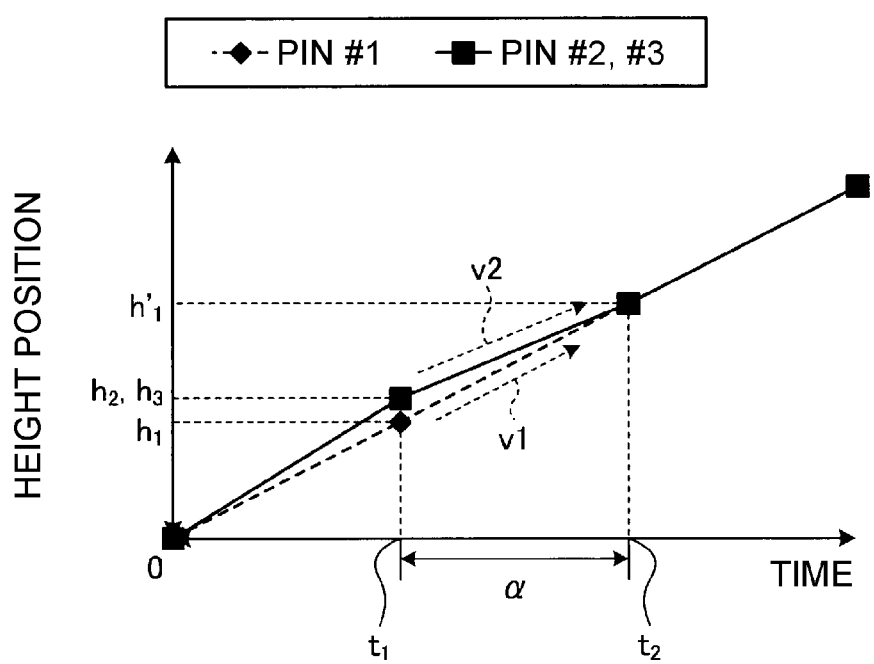
FIG. 4 is a view illustrating a specific example of a pin control method according to one exemplary embodiment.

Next, a specific example of the pin control method illustrated in FIG. 3 will be described with reference to FIG. 4. FIG. 4 is a view illustrating a specific example of a pin control method according to one exemplary embodiment. In FIG. 4, the horizontal axis represents the time and the vertical axis represents the height positions of the plurality of pins 70. Here, it is assumed that three pins 70 (pins #1 to #3) are provided as the plurality of pins 70.

First, driving of the pins #1 to #3 is started at a certain time 0. At this time, the driving speeds of the pins #1 to #3 are set to the same speed.

After the driving of the pins #1 to #3 is started, the respective height positions of the pins #1 to #3 are measured at a time t1, which is the measurement timing. In the example of FIG. 4, a height position $h_2$ of the pin #2 and a height position $h_3$ of the pin #3 match with each other, and a height position $h_1$ of the pin #1 is lower than the height position $h_2$ of the pin #2 and the height position $h_3$ of the pin #3. That is, due to the friction between the pin #1 and the corresponding seal member, the driving speed of pin #1 is slower than the initially set speed at the time $t_1$.

Then, a reference pin, which serves as the reference for speed control, is selected from the pins #1 to #3 using the measured height positions $h_1$ to $h_3$. In the example of FIG. 4, the pin #1 having the lowest height position, from the pins #1 to #3, is selected as the reference pin.

When the pin #1 is selected as the reference pin, with respect to the pin #1, a reference height position $h_1'$, which is the height position at a time $t_2$ when a predetermined time $\alpha$ has passed from the time $t_1$, is estimated. Specifically, the driving speed $v_1$ of the pin #1 at the time $t_1$ is calculated based on the passed time $t_1$ from the time 0 to the time $t_1$ and the height position $h_1$ of the reference pin (that is, the pin #1) measured at the time $t_1$. The driving speed $v_1$ of the pin #1 is represented by the following Equation (1).

$$v_1 = h_1/t_1 \quad (1)$$

Then, the reference height position $h_1'$ is estimated based on the calculated driving speed $v_1$ of the pin #1, the predetermined time $\alpha$, and the height position $h_1$ of the pin #1 measured at the time $t_1$. The reference height position $h_1'$ is represented by the following Equation (2).

$$h_1' = h_1 + \alpha \cdot v_1 \quad (2)$$

When the reference height position $h_1'$ is estimated, the adjustment speed $v_2$ for making the height positions of the pins other than the reference pin (that is, the pin #1) match with the reference height position $h_1'$ is calculated. Since the height position $h_2$ of the pin #2 matches with the height position $h_3$ of the pin #3, here, it is assumed that the pins, other than the reference pin, are the pin #2. Specifically, the adjustment speed $v_2$ for making the height position of the pin #2 match with the reference height position $h_1'$ is calculated based on the reference height position $h_1'$, the height position $h_2$ of the other pin (that is, the pin #2) at the time $t_1$, and the predetermined time $\alpha$. The adjustment speed $v_2$ is represented by the following Equation (3).

$$v_2 = (h_1' - h_2)/\alpha \quad (3)$$

Further, since the height position $h_2$ of the pin #2 matches with the height position $h_3$ of the pin #3, the adjustment speed $v_3$ for making the height position of the pin #3 match with the reference height position $h_1'$ is represented by Equation (4) as follows.

$$v_3 = (h_1' - h_3)/\alpha = (h_1' - h_2)/\alpha = v_2 \quad (4)$$

Subsequently, the driving units 72, which drive the other pins (that is, the pins #2 and #3), are controlled so that the driving speeds of the pins #2 and #3 are adjusted to the adjustment speed $v_2$. Thereby, at the time $t_2$ when the predetermined time $\alpha$ has passed from the time $t_1$, the difference between the height position of the pin #1, which is the reference pin, and the height positions of the pins #2 and #3, which are the pins other than the reference pin, is prevented. In the example of FIG. 4, the difference between the height positions of the pins #1 to #3 is zero at the time $t_2$.

As described above, according to one exemplary embodiment, the respective height positions of the plurality of pins 70, which is vertically driven respectively by the plurality of driving units 72, while supporting the wafer W, are measured, and the reference pin, which serves as the reference for speed control, is selected from the plurality of pins 70 using the measured height positions of the plurality of pins 70. Then, with respect to the selected reference pin, the reference height position, which is the height position after the predetermined time has passed since the height positions of the plurality of pins 70 were measured, is estimated. Then, the adjustment speed for making the height positions of the pins other than the reference pin match with the estimated reference height position is calculated, and the driving units 72, which drive the other pins, are controlled so that the driving speeds of the other pins are adjusted to the adjustment speed. Therefore, the difference between the height positions of the plurality of pins 70 is prevented. As a result, it is possible to prevent misalignment of the wafer W due to the difference between the height positions of the plurality of pins 70, which supports the wafer W.

OTHER EMBODIMENTS

In the above exemplary embodiment, the pin control method in a case of raising the plurality of pins 70 has been described by way of example, but the disclosed pin control method may be applied to a case of lowering the plurality of pins 70. In other words, the disclosed pin control method may be applied in a case of lowering the plurality of pins 70, to which the wafer W has been transferred from the transfer arm, toward the stage ST. In this case, in the flowchart illustrated in FIG. 3, in a case of determining whether or not the height positions of all of the pins 70 reach the predetermined position (step S104), for example, the placement surface or the reference surface that is lower than the placement surface by a predetermined distance may be adopted as the "predetermined position".

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate processing apparatus comprising:
a processing container;
a placement table provided in the processing container and configured to place a substrate thereon;
a plurality of pins provided on the placement table so as to protrude and retreat from the placement surface of the placement table and configured to perform delivery of the substrate;

a plurality of driving units configured to vertically drive the plurality of pins, respectively;

a plurality of measuring devices each including an encoder configured to measure height positions of the plurality of pins, respectively; and a controller configured to: measure the height positions of the plurality of pins, which is vertically driven respectively by the plurality of driving units while supporting the substrate; select a reference pin, which serves as a reference for speed control, from the plurality of pins using measured height positions of the plurality of pins; estimate, with respect to the selected reference pin, a reference height position, which is a height position after a predetermined time has passed since the height positions of the plurality of pins were measured; calculate an adjustment speed for making the height positions of the pins other than the reference pin match with the estimated reference height position; and control the driving units, which drive the other pins, to adjust driving speeds of the other pins to the adjustment speed.

2. The substrate processing apparatus according to claim 1, wherein, when the reference pin is selected, the controller is further configured to select, as the reference pin, a pin having a lowest height position or a highest height position, from the plurality of pins when the measured height positions of the plurality of pins do not match with each other.

3. The substrate processing apparatus according to claim 1, wherein, when the reference height position is estimated, the controller is further configured to calculate a driving speed of the reference pin at a measurement timing where the height positions of the plurality of pins are measured, based on a passed time from start of driving of the plurality of pins by the plurality of driving units to the measurement timing and the height position of the reference pin measured at the measurement timing; and estimate the reference height position based on the calculated driving speed of the reference pin, the predetermined time, and the height position of the reference pin measured at the measurement timing.

4. The substrate processing apparatus according to claim 1, wherein, when the respective height positions are measured, the controller is further configured to newly measure the respective height positions of the plurality of pins whenever the predetermined time has passed since the height positions of the plurality of pins were measured last time, and repeatedly, select, estimate, and adjust until the newly measured height positions of the plurality of pins match with each other.

5. The substrate processing apparatus according to claim 4, wherein, when the driving speeds are adjusted, the controller is further configured to control the driving units, which drive the other pins, to adjust the driving speeds of the other pins to a driving speed of the reference pin when the height positions of the plurality of pins match with each other.

6. The substrate processing apparatus according to claim 1, wherein the height positions of the plurality of pins are positions of tip ends of the plurality of pins on the basis of a placement surface of a placement table for the substrate or a reference surface that is lower than the placement surface by a predetermined distance.

* * * * *